(12) United States Patent
Chua et al.

(10) Patent No.: US 6,304,588 B1
(45) Date of Patent: Oct. 16, 2001

(54) METHOD AND STRUCTURE FOR ELIMINATING POLARIZATION INSTABILITY IN LATERALLY-OXIDIZED VCSELS

(75) Inventors: Christopher L. Chua, San Jose; Robert L. Thornton, Los Altos; David W. Treat, San Jose, all of CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/389,160

(22) Filed: Sep. 2, 1999

Related U.S. Application Data

(63) Continuation-in-part of application No. 09/364,614, filed on Jul. 29, 1999, now abandoned, which is a continuation-in-part of application No. 08/940,867, filed on Sep. 30, 1997, now Pat. No. 5,978,408.
(60) Provisional application No. 60/037,175, filed on Feb. 7, 1997.

(51) Int. Cl.[7] .................... H01S 3/08; H01S 5/00

(52) U.S. Cl. .............................. 372/46; 372/96

(58) Field of Search .................... 372/45, 46, 50, 372/96

(56) References Cited

U.S. PATENT DOCUMENTS

| 5,331,654 | * | 7/1994 | Jewell et al. ............... | 372/45 |
|---|---|---|---|---|
| 5,412,680 | * | 5/1995 | Swirhun et al. ............ | 372/45 |
| 5,493,577 |   | 2/1996 | Choquette et al. .......... | 372/46 |
| 5,727,014 | * | 3/1998 | Wang et al. ................. | 372/96 |
| 5,896,408 |   | 4/1999 | Corzine et al. .............. | 372/46 |
| 6,075,804 | * | 6/2000 | Deppe et al. ................ | 372/96 |
| 6,208,681 | * | 3/2001 | Thornton ..................... | 372/96 |

FOREIGN PATENT DOCUMENTS

| 0 772 269 A1 | 5/1997 | (EP) . |
|---|---|---|
| 0 898 344 A2 | 2/1999 | (EP) . |

OTHER PUBLICATIONS

Choquette, K.D. et al. "Control of Vertical–Cavity Laser Polarization with Anisotropic Transverse Cavity Geometries". *IEEE Photonics Technology Letters*, vol. 6, No. 1, Jan. 1994, pp. 40–42.

Chua, C.L. et al. "Anisotropic apertures for polarization–stable laterally oxidized vertical–cavity lasers". *Applied Physics Letters*, vol. 73, No. 12, Sep. 21, 1998, pp. 1631–1633.

Wipiejewski, T. et al. "Characterization of Two–Sided Output Vertical–Cavity Laser Diodes by External Optical Feedback Modulation". Proceedings of the Lasers and Electro–Optics Society Annual Meeting (LEOS), San Jose, Nov. 15–18, 1993, Co–Located with OPTCON '93, Nov. 15, 1993, Institute of Electrical and Electronics Engineers, pp. 564–565.

(List continued on next page.)

*Primary Examiner*—Quyen Leung

(57) ABSTRACT

The polarization instability inherent in laterally-oxidized VCSELs may be mitigated by employing an appropriately-shaped device aperture, a misoriented substrate, one or more cavities or employing the shaped device aperture together with a misoriented substrate and/or cavities. The laterally-oxidized VCSELs are able to operate in a single polarization mode throughout the entire light output power versus intensity curve. Combining the use of misoriented substrates with a device design that has an asymmetric aperture that reinforces the polarization mode favored by the substrate further improves polarization selectivity. Other device designs, however, can also be combined with substrate misorientation to strengthen polarization selectivity.

15 Claims, 19 Drawing Sheets

OTHER PUBLICATIONS

Yoshikawa, T. et al. "Complete polarization control of 8×8 vertical–cavity surface–emitting laser matrix arrays". *Applied Physics Letters*, vol. 66, No. 8, Feb. 20, 1995, pp. 908–910.

Chua, C.L. Et Al. "Planar Laterally Oxidized Vertical–Cavity Lasers for Low–Threshold High–Density Top–Surface–Emitting Arrays," IEEE Photonics Technology Letters, vol. 9, No. 8, Aug. 1, 1997; pp. 1060–1062.

Evans, P.W. Et Al. "Edge–Emitting Quantum Well Heterostructure Laser Diodes with Auxillary Native–Oxide Vertical Cavity Confinement," Applied Physics Letters, vol. 67, No. 21, Nov. 20, 1995; pp. 3168–3170.

Huffaker, D.L. Et Al. "Fabrication of High–Packing–Density Vertical Cavity Surface–Emitting Laser Arrays Using Selective Oxidation," IEEE Photonics Technology Letters, vol. 8, No. 5, May 1, 1996; pp. 596–598.

* cited by examiner

METHOD AND STRUCTURE FOR ELIMINATING POLARIZATION INSTABILITY IN LATERALLY-OXIDIZED VCSELS

CROSS REFERENCE TO RELATED APPLICATIONS

This application is a continuation in part of application Ser. No. 09/364,614 filed Jul. 29, 1999 now abandoned which is a continuation in part of application Ser. No. 08/940,867 filed Sep. 30, 1997 now U.S. Pat. No. 5,978,408 which claims the benefit of Provisional Application 60/037,175 filed Feb. 7, 1997, all the contents of the preceding applications are incorporated herein by reference in their entirety.

FIELD OF INVENTION

The present invention relates generally to semiconductor lasers. More specifically, the invention allows for the elimination of the polarization instability in laterally-oxidized vertical-cavity surface emitting lasers.

BACKGROUND OF INVENTION

Solid state semiconductor lasers are important devices in applications such as optoelectronic communication systems and high-speed printing systems. Recently, there has been an increased interest in vertical cavity surface emitting lasers ("VCSEL's") although edge emitting lasers are currently used in the vast majority of applications. A reason for the interest in VCSEL's is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSEL's incorporate the mirrors monolithically in their design, they allow for on-wafer testing and the fabrication of one-dimensional or two-dimensional laser arrays.

A known technique to fabricate VCSEL's is by a lateral oxidation process, as schematically illustrated in FIGS. 1 and 2. Under this approach, a laser structure comprising a plurality of layers is formed upon substrate 10. These layers include an active layer 12 and an AlGaAs layer 14 with a high aluminum content. The AlGaAs layer 14 is placed either above or below the active layer of a laser structure. Then, the layered structure is masked and selectively etched to form a mesa structure 22 as illustrated in FIG. 2. As a result of the etching, the AlGaAs layer 14 with a high aluminum content adjacent to the active layer 12 is exposed at the edges of the mesa structure 22. To form the lasing emissive region or "aperture", this AlGaAs layer is oxidized laterally from the edges towards the center of the mesa structure as represented by arrows A. Other layers in the structure remain essentially unoxidized since their aluminum content is lower. Consequently, their oxidation rates are also substantially lower. Therefore, only the AlGaAs layer with high aluminum content is being oxidized. The oxidized portions of the high aluminum content layer become electrically non-conductive as a result of the oxidation process. The remaining unoxidized region, which is conductive, in the AlGaAs layer forms the so-called "aperture", a region which determines the current path in the laser structure, and thereby determines the region of laser emission. A VCSEL formed by such a technique is discussed in "Selectively Oxidized Vertical Cavity Surface Emitting Lasers With 50% Power Conversion Efficiency," Electronics Letters, vol. 31, pp.208–209 (1995).

The current lateral oxidation approach has several disadvantages, such as large mesa, large oxidation region, and poor control of the aperture size. A key disadvantage of this approach is the difficulty in controlling the amount of oxidation. Generally, the desired device aperture is on the order of one to ten microns ($\mu$m), which means that several tens of microns of lateral oxidation will typically be required in order to fabricate the device when oxidizing in from the sides of the much larger mesa, which must typically be 50 to 100 microns in size. Since the size of the resulting aperture is small relative to the extent of the lateral oxidation regions, the devices formed generally have severe variations in aperture size as a result of non-uniform oxidation rates from wafer to wafer and across a particular wafer. The oxidation rate of AlGaAs depends strongly on its aluminum composition. Any composition non-uniformity will be reflected by changes in the oxidation rate, which in turn creates uncertainty in the amount of oxidation. The process is also relatively temperature-sensitive. As the oxidation rate varies, it is difficult to ascertain the extent to which a laser structure will be oxidized, thereby decreasing reproducibility in device performance. In short, such a process often creates various manufacturability and yield problems.

Another disadvantage of a VCSEL formed by a traditional lateral oxidation approach is the difficulty it creates in forming high density laser arrays. In order to oxidize a buried layer of high aluminum content, an etching process is performed leaving a mesa. After the etching of this mesa, lateral oxidation is performed such that the oxidized regions define a laser aperture of a particular size. The use of a mesa structure, in part, limits the minimum spacing between two lasers in an array. The step height of the mesa is typically several microns because of the need to etch through a thick upper DBR mirror. Additionally, the top surface of the mesa also has to be relatively large so that a metal contact can be formed on it without covering the lasing aperture. Typically, the minimum size of an electrical contact is approximately 50×50 $\mu$m$^2$. Hence, the step height of the mesa and the placement of the electrical contact on the surface make it difficult to form highly compact or high density laser arrays.

A solution to some of the problems associated with a typical mesa structure is the use of a shallow mesa. In order to use a shallow mesa, the upper mirror is not formed by an epitaxial process. Instead, the upper mirror is formed by a deposited multilayer dielectric material, which reflects light. Electrical contact is made directly onto the upper portion of the active region. Devices formed under this approach have been fabricated on mesas with widths of approximately twelve microns. However, the added complexity of depositing a dielectric material and using a liftoff process to define the contact make it difficult to optimize the devices for low threshold current and high efficiency.

A VCSEL formed by a traditional lateral oxidation approach often suffers from poor mechanical or structural integrity. It is well-known that the upward pressure applied during a packaging process may cause delamination of the entire mesa since the bonding of the oxide layer to the unoxidized GaAs or AlGaAs is generally weak.

Light from typical VCSELs is usually polarized along one of two orthogonal directions along the wafer surface. The dominant polarization can switch back and forth between these two orthogonal orientations as the operating current to the VCSEL is varied because there is no natural preference for either orthogonal direction. The polarization instability is a major drawback because it limits VCSELs to applications where no polarization sensitive optical elements are present. Moreover, if the VCSEL is modulated, sudden changes in polarization states can result in undesirable light intensity fluctuations that contribute to signal noise.

There are several known methods for controlling VCSEL polarization. These include making devices with anisotropic mesa geometries as described by K. Choquette and R. Leibenguth in "Control of vertical-cavity laser polarization with anisotropic cavity geometries", IEEE Photonics Technology Letters, vol. 6, no. 1, pp. 40–42, 1994, making devices with tilted etched-pillar structures as described by H. Y. Chu et al. in "Polarization characteristics of index-guided surface emitting lasers with tilted pillar structure", IEEE Photonics Technology Letters, vol. 9, no. 8, pp. 1066–1068, 1997, use of dielectric top mirrors with coated sidewalls as described by M. Shimuzi et al. in "Polarisation control for surface emitting lasers", Electronics Letters, vol. 27, no. 12, pp. 1067–1069, 1991, using substrates having a misoriented surface as described in Compound Semiconductor, May/June, p. 18, 1997 or milling a cavity next to a completed gain-guided device as described by P. Dowd et al. in "Complete polarisation control of GaAs gain-guided top-surface emitting vertical cavity lasers", Electronic Letters, vol. 33, no. 15, pp. 1315–1317, 1997.

BRIEF SUMMARY OF INVENTION

Large arrays of densely-packed VCSELs are attractive light sources for applications such as laser printbars, where there may be thousands of semiconductor lasers on a small chip operating to transfer print images at high speed. Laterally-oxidized VCSELs are of particular interest because these VCSELs operate with exceedingly low threshold currents and high efficiencies, properties that are important for densely-packed VCSEL arrays. The polarization instability inherent in laterally-oxidized VCSELs may be mitigated by employing an appropriately-shaped device aperture, a misoriented substrate, one or more cavities or employing the shaped device aperture together with a misoriented substrate and/or cavities. The laterally-oxidized VCSELs are able to operate in a single polarization mode throughout the entire light output power versus intensity curve.

While a certain degree of polarization selectivity can be achieved by making devices on substrates whose surfaces are misoriented from, for example, the {100} surface, this method often does not produce sufficient polarization selectivity. A more effective solution involves combining the use of misoriented substrates with a device design that has an asymmetric aperture that reinforces the polarization mode favored by the substrate. Other device designs, however, can also be combined with substrate misorientation to strengthen polarization selectivity.

An alternative device design is discussed in "Complete polarisation control of GaAs gain-guided top-surface emitting vertical cavity laser" by P. Dowd, et al. In this VCSEL, deep 1 µm wide cavities placed between 1 and 2 µm from the cavity aperture produce differential loss for the two polarization modes. The cavities are formed after device fabrication using a focus ion beam etcher. The favored polarization mode using this method is found to be in a direction perpendicular to the cavity. In this example, enhanced polarization selectivity can by achieved by fabricating the VCSEL on a misoriented substrate and aligning the cavity along a direction perpendicular to the polarization mode favored by the misoriented substrate.

Another method of producing polarization selectivity involves applying an anisotropic stress either by external means or by a built in mechanism as discussed in "Engineered polarization control of GaAs/AlGaAs surface-emitting lasers by anisotropic stress from elliptical etched substrate hole" by T. Mukaihara, et al. An elliptical hole is first etched and a high thermal expansion coefficient material is then deposited on the hole. The high thermal expansion material can be a thin film, an epitaxial layer, or an adhesive. The resulting anisotropic stress produces a gain difference between the two polarization modes resulting in a favored polarization direction along the short axis of the elliptical hole. Enhanced polarization selectivity can again be achieved by fabricating the VCSEL on a misoriented substrate and aligning the short axis of the elliptical hole to the polarization direction favored by the misoriented substrate.

A VCSEL employing an asymmetric etched mesa can also produce polarization preference as illustrated in "Control of vertical-cavity laser polarization with anisotropic transverse cavity geometries" by K. Choquette, et al. VCSELs utilizing dumbbell-shaped mesas have polarization preferences along the long axis of the dumbbell. The polarization preference can again be strengthened by making the device on a misoriented substrate and by positioning the long axis of the dumbbell-shaped mesa along a polarization direction favored by the misoriented substrate.

There are various means of producing a polarization preference by different VCSEL designs. However, most VCSEL designs do not produce sufficient polarization selectivity to completely suppress the non preferred polarization mode. The polarization selectivity can be significantly improved by fabricating these devices on misoriented substrates and designing the VCSELs so that their favored polarization direction reinforces the polarization preference that is inherent in the misoriented substrate.

The advantages and objects of the present invention will become apparent to those skilled in the art from the following detailed description of the invention, its preferred embodiments, the accompanying drawings, and the appended claims.

DETAILED DESCRIPTION

Figure 1:
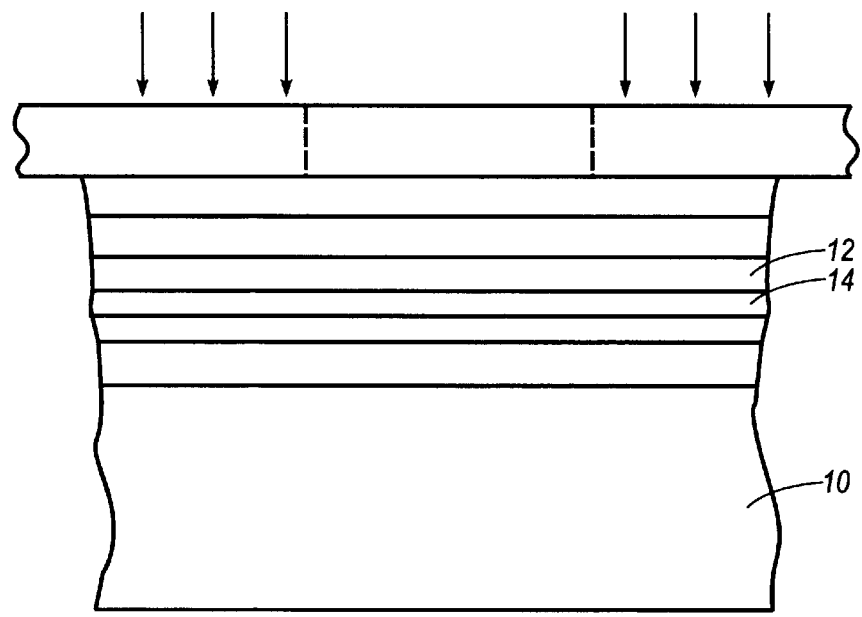
FIGS. 1 and 2 illustrate a prior art approach to the formation of a laser aperture in a VCSEL structure.
Figure 2:
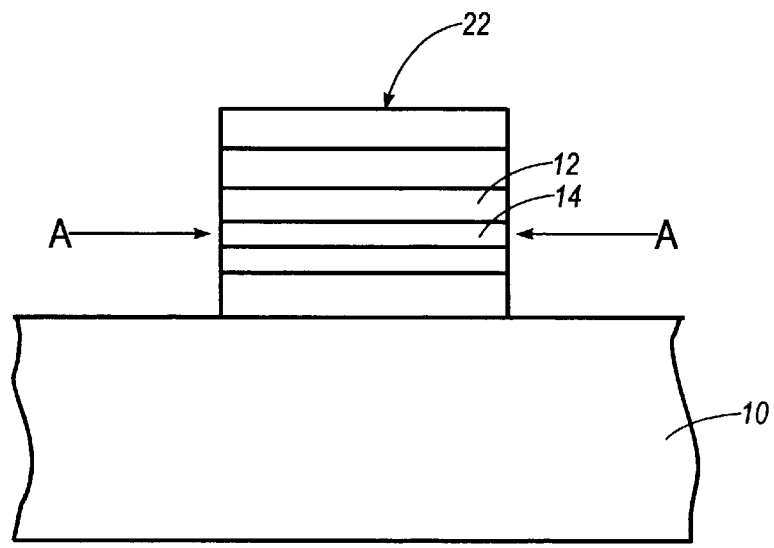
Figure 3:
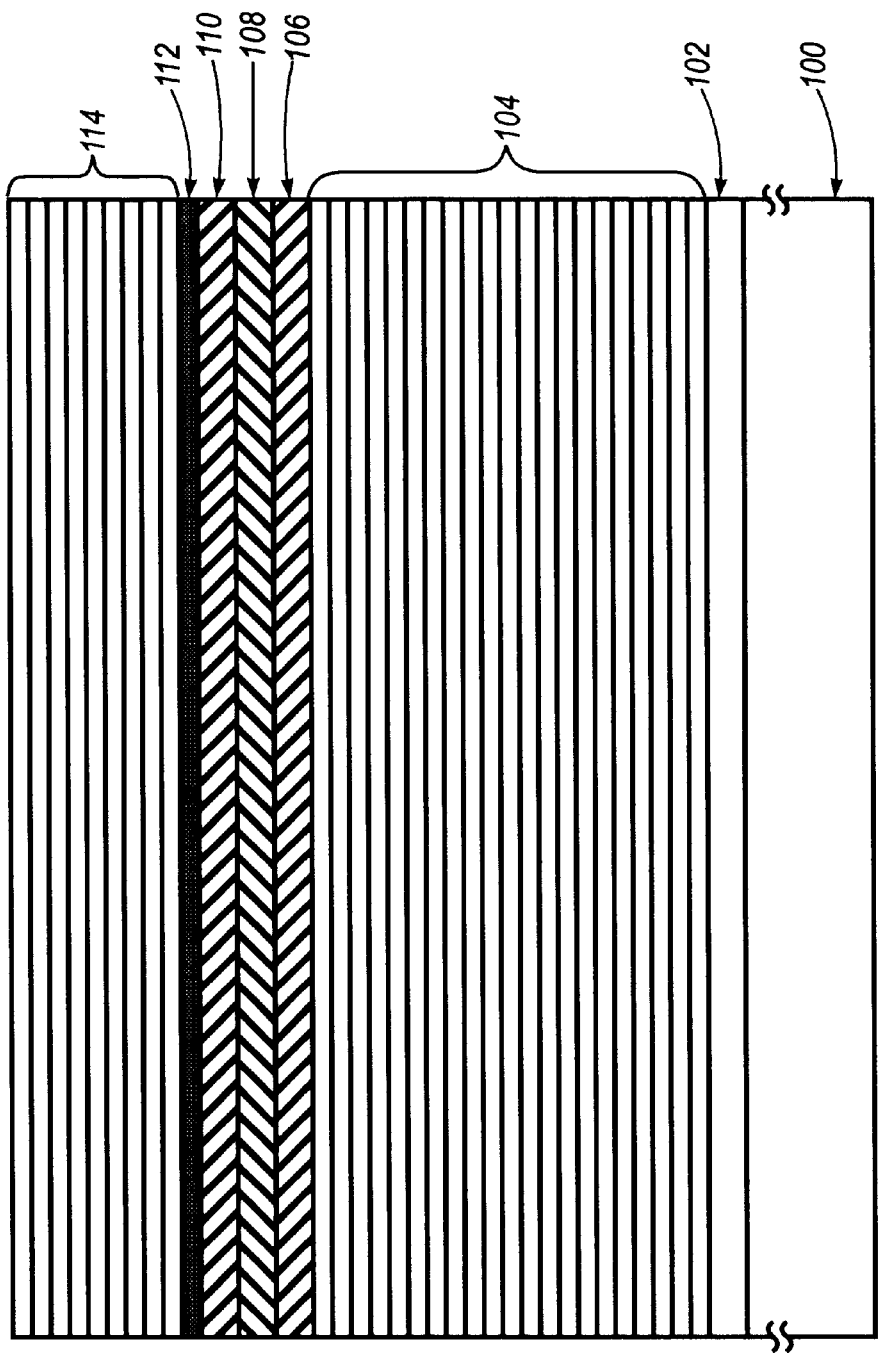
FIG. 3 illustrates a side sectional view of a semiconductor structure which is used to form the preferred embodiment of the present invention.

FIG. 3 illustrates a semiconductor structure which is used to form the preferred embodiment of the present invention. The structure illustrated includes a number of semiconductor layers, which can be used to form a vertical cavity surface emitting laser. As will be apparent, the layers are illustrated schematically only and bear no relationship to the relative thicknesses each to the other. As shown in FIG. 3, an n-type GaAs buffer layer 102 of approximately 200 nanometers is grown on an n-type GaAs substrate 100 using an epitaxial deposition process known as metalorganic chemical vapor deposition ("MOCVD"). The doping level of the n-type GaAs substrate and GaAs buffer are typically around the range of $3\times10^{18}$ cm$^{-3}$ to $7\times10^{18}$ cm$^{-3}$ so that a reasonably low resistance can be achieved in these layers. The semiconductor layers may also be deposited on a substrate by liquid phase epitaxy ("LPE"), molecular beam epitaxy ("MBE"), or other known crystal growth processes.

Above the GaAs buffer layer 102 is a superlattice structure for forming a lower distributed Bragg reflector ("DBR") 104 which provides a portion of the necessary internal reflection in a VCSEL structure. The lower DBR 104 is typically formed by multiple pairs of an AlGaAs layer with a high aluminum content (approximately 86% aluminum) and another AlGaAs layer with a low aluminum content (approximately 16% aluminum). After the growth of a number of layer pairs (typically 35 Si doped pseudoparabolically graded DBR pairs), a final AlGaAs layer with a high aluminum content is deposited before growing the first cladding layer 106 of the optical cavity. A typical thickness of each layer pair is approximately 120 nanometers for a laser emitting at 820 nanometers. The total thickness of each layer pair is designed to be equal to one half of the optical wavelength at the intended wavelength of laser operation. The thickness of the final high aluminum content layer is designed to be a quarter of the optical wavelength at the intended wavelength of laser operation. The AlGaAs layer with a high aluminum content contains approximately 86% aluminum. The aluminum content of the AlGaAs layer with a high aluminum content should be sufficiently high to provide for a low refractive index, but not so high as to oxidize easily. The AlGaAs layer with a low aluminum content has an aluminum content of approximately 16%. The composition of the AlGaAs layer with a low aluminum content should typically have sufficient aluminum so that it is non-absorptive at the lasing wavelength.

Under this embodiment, since light is outcoupled through the top surface of the semiconductor sample, the reflectivity of the lower DBR 104 should be as close to 100% as possible in order to achieve high internal reflection. High internal reflection generally reduces the threshold current of a laser. It is well-known that the reflectivity of the lower DBR 104 is generally a function of the difference in the refractive indices between the two AlGaAs layers of the superlattice and the number of layer pairs in the structure. The greater the difference in the refractive indices, the fewer number of pairs are required to obtain a given reflectivity. For example, 30 to 40 pairs of AlGaAs layers may be used to form the lower DBR structure 104.

After the lower DBR structure 104 has been deposited epitaxially, an AlGaAs cladding layer 106 is deposited. This lower AlGaAs cladding layer 106 has an aluminum content of about 58% and is n-type with a doping level of $1\times10^{18}$ cm$^{-3}$ to $5\times10^{18}$ cm$^{-3}$. Its thickness is approximately 100 nanometers. Above this AlGaAs cladding layer 106 is the active layer 108 of the laser structure which comprises four InAlGaAs quantum wells with a thickness of about four to ten nanometers, typically about four nanometers, along with five $Al_{0.35}Ga_{0.65}As$ barriers with a thickness of about two to eight nanometers, typically about six nanometers. Depending upon the desired output wavelength of the laser structure, pure GaAs or AlGaAs with a low aluminum content may be also used to form the quantum well structures. Nothing in this invention prevents the use of a single quantum well or other multiple quantum well ("MQW") structures to form the active layer 108.

Above the active layer 108 is an upper AlGaAs cladding layer 110, which is structurally similar to the lower AlGaAs cladding layer 106 except for the polarity of its dopants. This upper cladding layer 110 has an aluminum content of about 58% but is p-type with a doping level of $1\times10^{18}$ cm$^{-3}$ to $4\times10^{18}$ cm$^{-3}$. Similar to the lower AlGaAs cladding layer 106, the thickness of top cladding layer 110 is also about 100 nanometers. These two AlGaAs cladding layers, 106 and 110, along with the active layer 108 generally form the optical cavity in which the desired optical gain can be attained. The total optical thickness of layers 106, 108, and 110 is adjusted to be equal to an integer multiple of the intended wavelength of laser operation.

Above the upper AlGaAs cladding layer 110 is an oxidation layer 112, which is used to form the laser aperture. The laser aperture controls the current flow and thus the lasing location in the active layer 108. Under this embodiment, this oxidation layer 112 is above the upper AlGaAs cladding layer 110. Nothing in this invention prevents the placement of this oxidation layer 112 in another location either further above or below the active layer 108. Typically, this oxidation layer 112 has an aluminum content of approximately 95% and a thickness of about 70 nanometers. Typically, this oxidation layer 112 constitutes the first layer of an upper DBR mirror and contains a p-type dopant.

After the oxidation layer 112 has been formed, the remainder of an upper DBR mirror 114 which contains p-type doping is deposited. The upper DBR mirror 114 is structurally similar to the lower DBR mirror 104 except for the polarity of its dopants. Additionally, the mirror layer closest to each side of the active region generally has a high aluminum content. In this embodiment, this high aluminum content layer is also the oxidation layer 112. In this embodiment, the reflectivity of the upper DBR 114 is typically 98% to 99% because light will be outcoupled through the surface of the semiconductor sample. Typically, 20 to 25 pairs of alternate AlGaAs layers are used to form this upper DBR mirror 114. Typically, a p-AlGaAs current spreading layer and a final 22 nanometer thick $p^+$ GaAs layer are grown above top DBR mirror 114.

Figure 4:
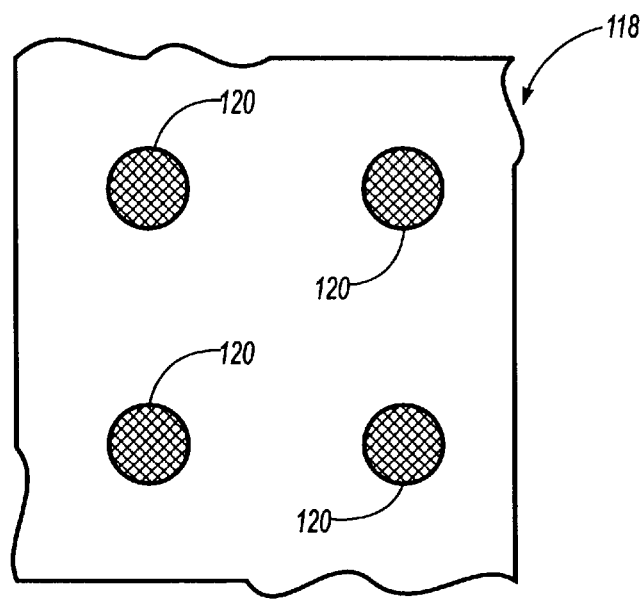
FIG. 4 is a top view of a portion of a mask which may be applied to the semiconductor structure shown in FIG. 1 under the present invention.

FIG. 4 is a top view of a portion of a mask which may be applied to the semiconductor structure shown in FIG. 3 under the present invention. First, as is conventional, a uniform layer of silicon nitride will be deposited over the entire semiconductor sample. Then, a photoresist layer 118 is deposited over the silicon nitride layer and is formed into the mask shown in FIG. 4 by a photolithographic process which removes photoresist material from four circular areas 120. The circular areas 120 form a pre-determined bounding pattern which will later be used to define the resulting aperture of a laser structure.

Figure 5:
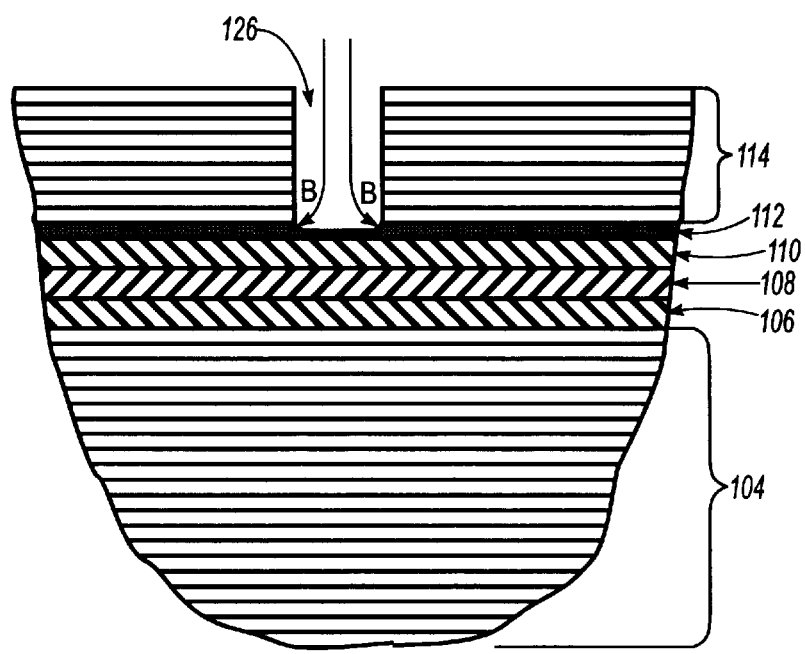
FIG. 5 is a partial side sectional view of the semiconductor structure of FIG. 1 with a cavity etched therein.
Figure 6:
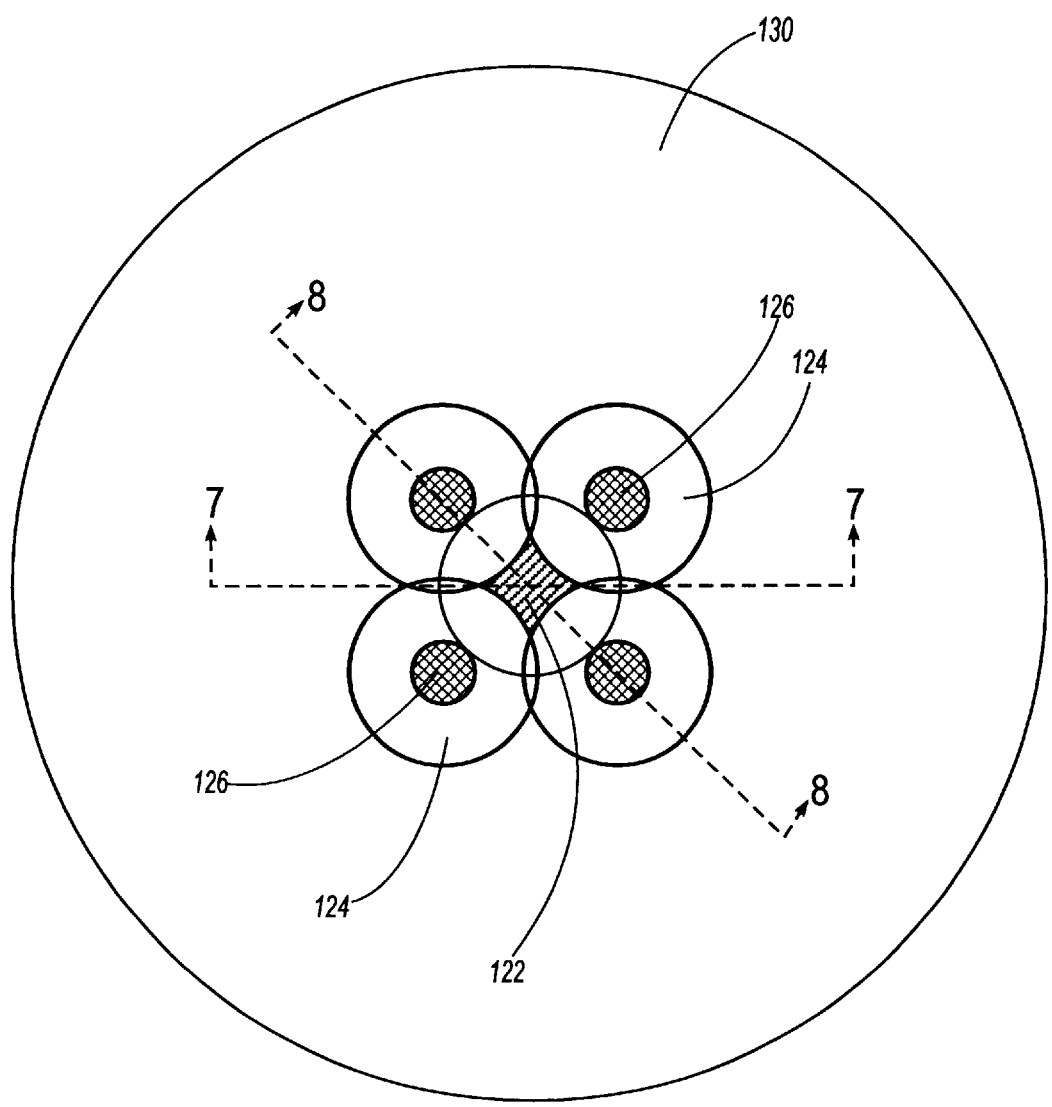
FIG. 6 is a simplified top view of a portion of an oxidation layer, wherein the layers above it have been removed.

As illustrated in FIG. 5, the sample then undergoes an etching process during which cylindrical cavities 126 are formed in the semiconductor structure through the four exposed circular areas 120. The etching is performed by a process such as reactive ion etching which provides for the formation of a deep depression with vertical sidewalls. The depth of each cylindrical cavity should extend at least into the oxidation layer 112, as shown in FIG. 5. After the formation of the cylindrical cavities and the removal of any photoresist on the surface, the semiconductor sample undergoes an oxidation. The sample is typically oxidized with water vapor in a nitrogen environment at elevated temperatures, in excess of 350° C. During the oxidation process, the oxidation layer 112 is exposed to the ambient through each cylindrical cavity, as indicated by arrows A. Thus, the oxidation layer 112, which comprises of AlGaAs with a high aluminum content, is oxidized radially outwards from each cavity 126, typically until the oxidized regions 124 surrounding each cavity approach one another and overlap, as can be seen in FIG. 6. However, a small non-oxidized gap between the oxidized regions may be permissible so long as electrical and optical fields are adequately confined. Although the cross section of each cavity has been described as being cylindrical, any suitable cross section may be used.

During the oxidation process, other layers in the structure remain essentially unoxidized since their aluminum content is lower. The oxidation rate of AlGaAs increases with the aluminum content in a generally exponential manner at constant temperature. The time duration of the oxidation process depends upon the aluminum content in the oxidation layer 112 and the oxidation temperature. A desirable, controllable oxidation duration would be a few tens of minutes. Therefore, the layer that is being oxidized is the AlGaAs which has a high aluminum content of close to 95%. The portion of the AlGaAs layer which remains unoxidized controls the current path through the active layer 108.

FIG. 6 is a largely simplified top view of the oxidation layer 112 shown in FIG. 3 assuming that all the layers above it have been removed. The shaded region 122 represents the laser aperture in oxidation layer 112 which determines the region of laser emission by active layer 108. It is formed by the oxidation process of the present invention. During the oxidation process, the oxidation fronts emanate through the oxidation layer from the pattern of four cavities 126, and the shaded region 122 is formed by the intersection of the boundaries of the oxidized regions 124. The oxidation fronts emanating from the cylindrical cavities 126 are also generally cylindrical, resulting in overlapping oxidized regions 124. The center of the overlapping regions 124 remains unoxidized. This unoxidized region forms the shaded area 122, which is the aperture of the laser structure. After the oxidation process, an ion implantation process, which is next described, is used to form isolation region 130 to isolate the laser structure from its neighbor.

After the oxidation process, the areas 124 are oxidized and the unoxidized portion 122 forms the aperture which controls the current path through the active layer 108. Current flow through that portion of the active layer 108 which lies below the aperture 122 results in an injected density of p-type and n-type carriers, resulting in optical amplification. At sufficiently high current flow, this optical amplification, in combination with feedback from the DBR mirrors, 104 and 114, will result in laser oscillation and emission from the active layer within the region defined by aperture 122 in oxidation layer 112.

Isolation region 130 (illustrated in FIGS. 6, 7 and 8), which is formed by using an ion implantation isolation process, is highly resistive. The typical implantation energies used in such a process are 50 KeV, 100 KeV, 200 KeV and 310 KeV. The dose is typically $3\times10^{15}$ cm$^{-2}$ at each energy level. The ion used to form the isolation region 402 is typically hydrogen.

Figure 7:
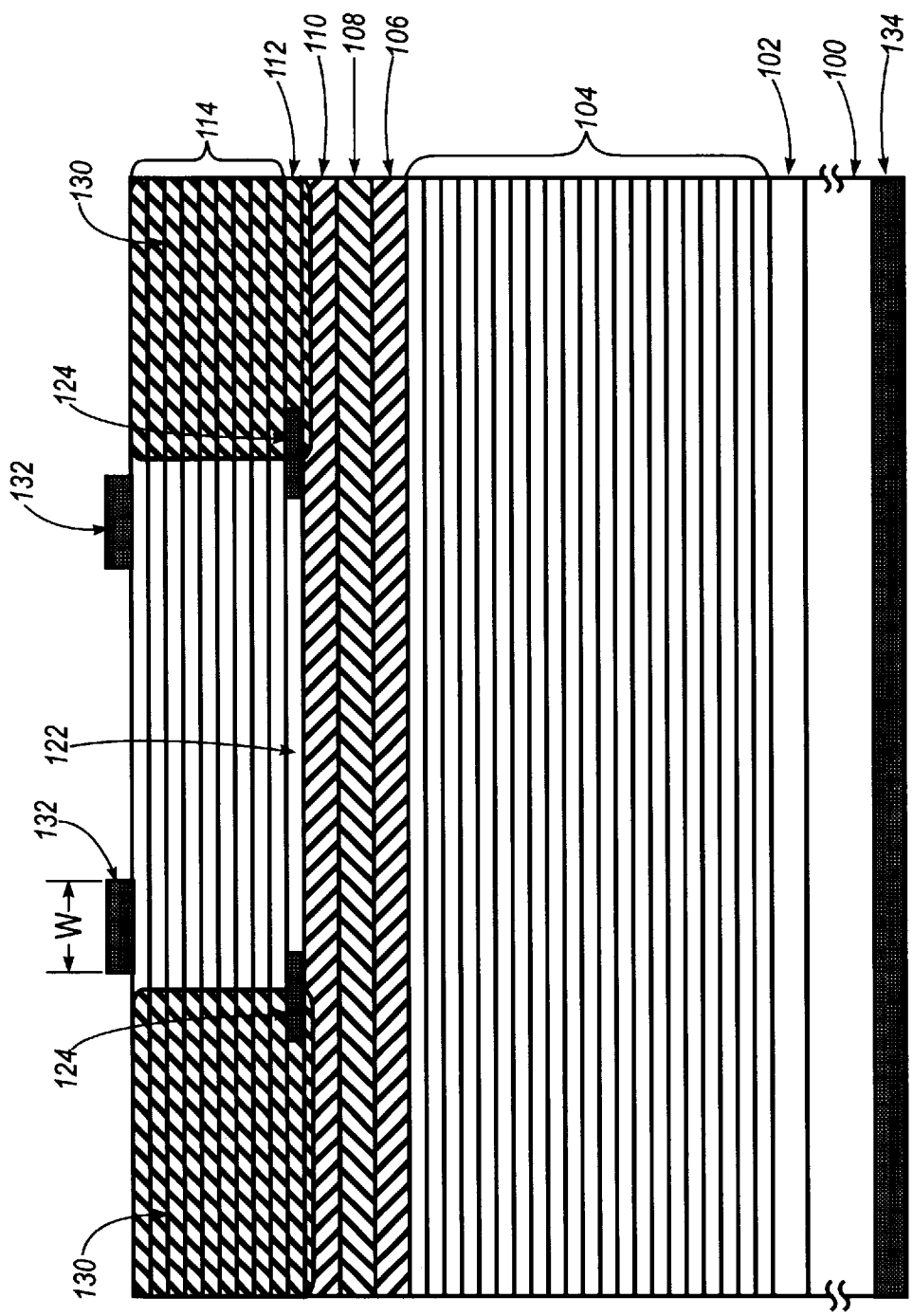
FIG. 7 is a cross-sectional view taken substantially along line 7—7 in FIG. 6 and in FIG. 9.
Figure 8:
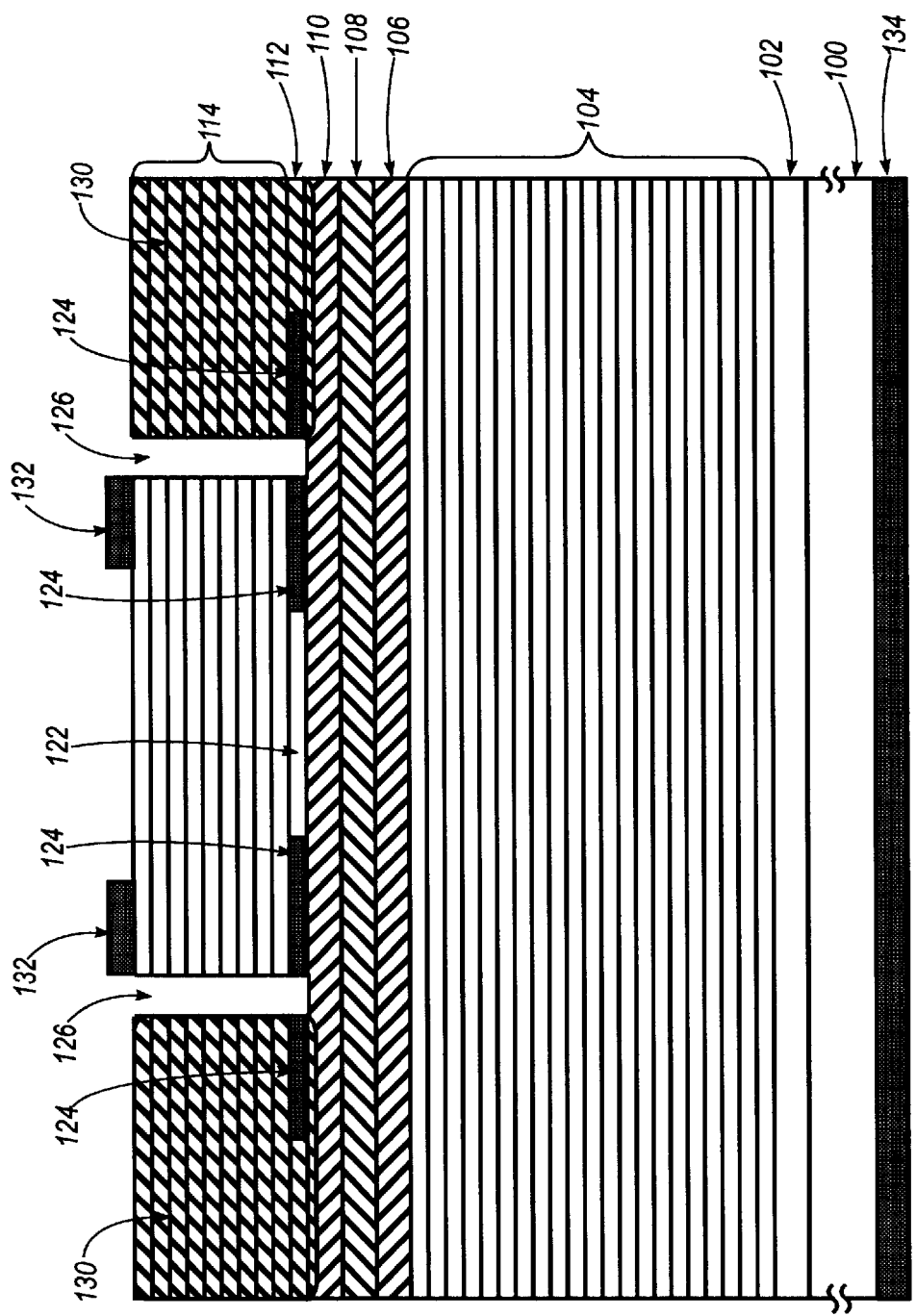
FIG. 8 is a cross-sectional view taken substantially along line 8—8 in FIG. 6 and in FIG. 9.
Figure 9:
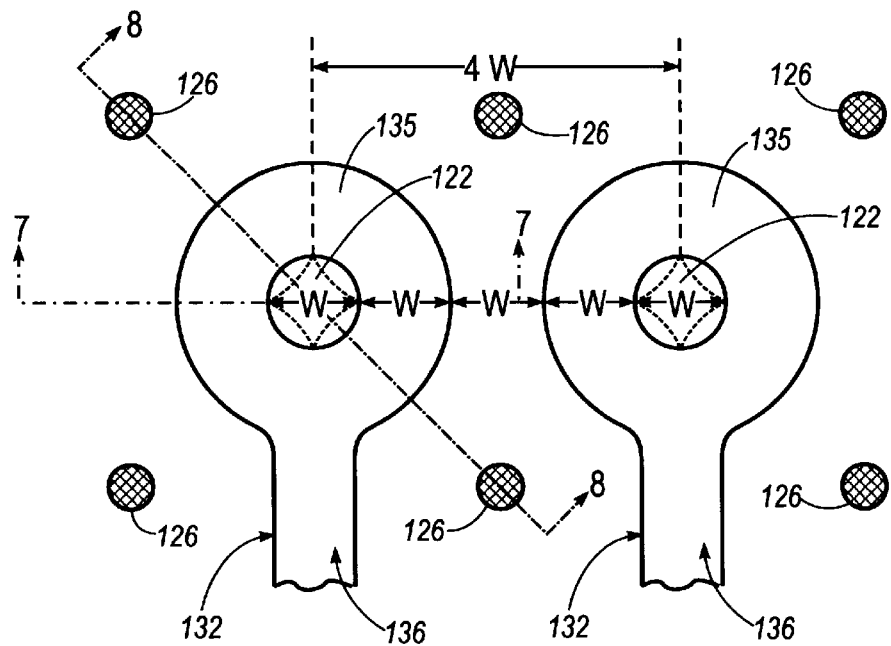
FIG. 9 is a top view of two adjacent VCSEL structures showing a non-transparent top contact.

After the isolation process, metal contacts 132 and 134 are formed on the top surface and the bottom surface of the semiconductor structure, respectively, for biasing the laser, as illustrated in FIGS. 7, 8 and 9. A typical material used for forming the contacts is a titanium/gold bilayer film.

FIG. 9 shows a top view of a VCSEL structure formed in accordance to the present invention after a typical metallization process to form the top contact 132. Views in the direction of section lines 7—7 and 8—8 in this Figure are also as illustrated in FIGS. 7 and 8. The top contact 132 is of a generally keyhole shape, including a circular portion 134 and an extension portion 136. The circular portion lies inboard of the cavities 126 and overlies the laser aperture 122. Since it is non-transparent it is made annular in shape so as to allow light to be coupled out of the laser through its central opening. The width "W" of the annular circular portion 134 is usually limited by the minimum line width achievable under the processing technology used, thus setting a lower limit on the pitch between adjacent VCSEL structures Thus, a typical pitch between the centers of two adjacent VCSEL apertures 122 would be "4W." However, if a transparent conductor is used (e.g. see FIG. 10), the pitch between adjacent VCSEL structures could be further reduced to be on the order of "2W" because the top contact could overlie the laser aperture 122. Moreover, the contact arrangement provides a direct current path to the optical mode at the center of aperture 122 and may be useful in applications where reduced mode partition noise is desired.

A typical transparent conductor is indium tin oxide ("ITO") which is deposited by a sputtering process prior to etching cavities 126 as described above. This procedure is self-aligned and greatly simplifies fabrication and is enabled by the stability of ITO during the lateral oxidation process (see "Low-threshold InAlGaAs vertical-cavity surface-emitting laser arrays using transparent electrodes" by C. L. Chua et al. in Applied Physics Letters, vol. 72, no. 9, 1001, which is incorporated by reference in its entirety). A half-wavelength thick ITO film is first deposited over the p+ GaAs contact layer overlying p-AlGaAs current spreading layer which is grown over DBR layer 114. The ITO film is then successively rapid thermal annealed at 300 and at 600° C. for 2 min each in a nitrogen ambient. The low-temperature anneal crystallizes the deposited amorphous ITO film, while the second, higher-temperature anneal induces ohmic contact formation between the ITO film and the p+ GaAs contact layer. The transparent ITO film attains a post anneal contact resistance of $2 \times 10^{-5}$ ohm cm$^2$, a sheet resistivity of $5 \times 10{-4}$ ohm cm, and a power transmission coefficient of 98% at an emission wavelength of 817 nanometers.

Figure 10:
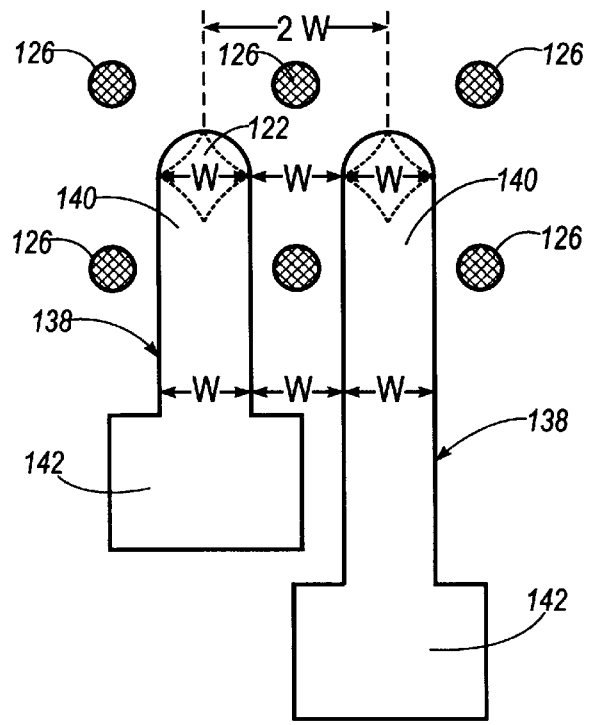
FIG. 10 is a top view of two adjacent VCSEL structures showing a transparent top contact.
Figure 11:
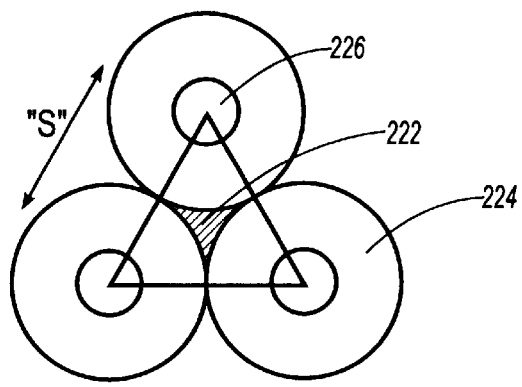
FIG. 11 shows a laser structure whose aperture is defined by a triangular bounding pattern of cavities.

Next a set of cavities 126, typically having a diameter of 2 μm delineating laser aperture 122 is patterned as shown in FIG. 10 for example. The ITO and underlying DBR layers 114 are then dry etched using chemically assisted ion beam etching in two successive self-aligned steps to form cavities 126 that reach oxidation layer 112, typically $Al_{0.94}Ga_{0.06}As$. Oxidation layer 112 is oxidized for 45 minutes at 415° C. in flowing steam. Oxidized regions 124 progress laterally outwards from each cavity 126, and on merging define laser aperture 122. Apertures 122 may typically range from 5 μm to 43 μm in diameter.

Positioning of cavities 126 is typically selected so that lateral oxidation needs to proceed by only a few micrometers from the perimeters of cavities 126. This reduced path of oxidation compared to typical etched pillar devices reduces the sensitivity of laser aperture 126 to variations in oxidation rates. The aluminum content of oxidation layer 112 is relatively low in order to lengthen the oxidation time so that transients are minimized. As noted above, the ITO film is not effected by the oxidation process.

An alternative embodiment of the top contact is shown in FIG. 10 and is identified by numeral 138. It comprises a transparent conductive contact finger 140 and contact pad 142, the contact finger overlying the laser aperture 122. After the formation of an electrical contact on the top surface, the bottom electrode 134 is formed by depositing metal on the bottom surface of the substrate 100 and is typically an evaporated eutectic Ge/Au metal.

Figure 12:
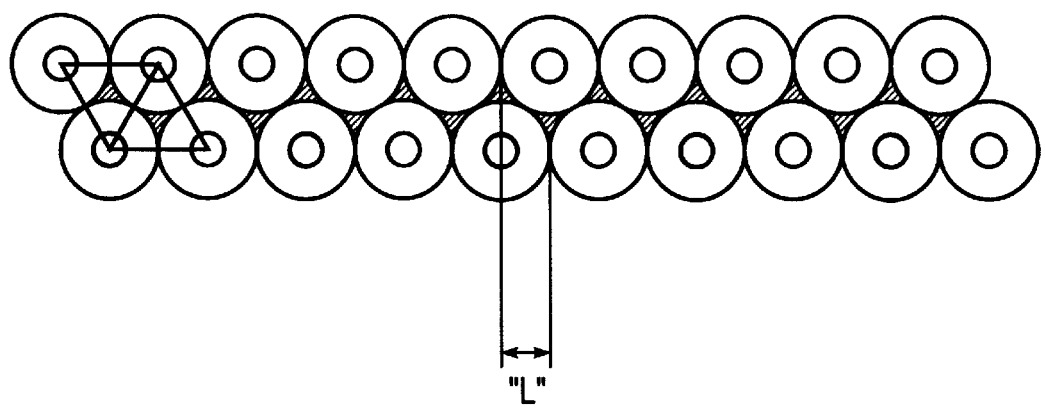
FIG. 12 shows an array of lasers which is formed by repeating the triangular bounding pattern shown in FIG. 11.

FIGS. 11, and 12,13,14 and 15, and 16,17 and 18 illustrate alternative packing arrangements for forming an array of lasers formed by the method of the present invention. In the laser device of FIG. 11 and an array of such devices shown in FIG. 12, each laser structure includes an aperture 222 defined by oxidized regions 224 surrounding a bounding pattern of three cylindrical cavities 226 positioned at the apexes of an equilateral triangle. The spacing between the centers of any two cavities is "S." As stated previously, during the oxidation process, an embedded AlGaAs layer with a high aluminum content will be oxidized radially outwardly from the cylindrical cavities 226 until the oxidized regions 224 overlap to form the unoxidized laser aperture 222. The packing arrangement shown in FIG. 11 may be repeated to form a laser array as shown in FIG. 12. If the spacing between the centers of two cylindrical cavities is "S," a typical linear spacing "L" between two laser apertures is approximately "S/2."

Figure 13:
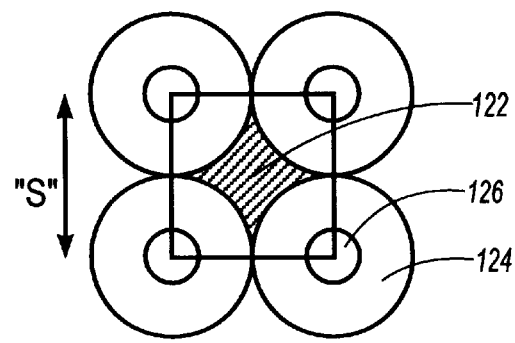
FIG. 13 shows a laser structure whose aperture is defined by a bounding pattern of four cavities arranged in a square pattern.
Figure 14:
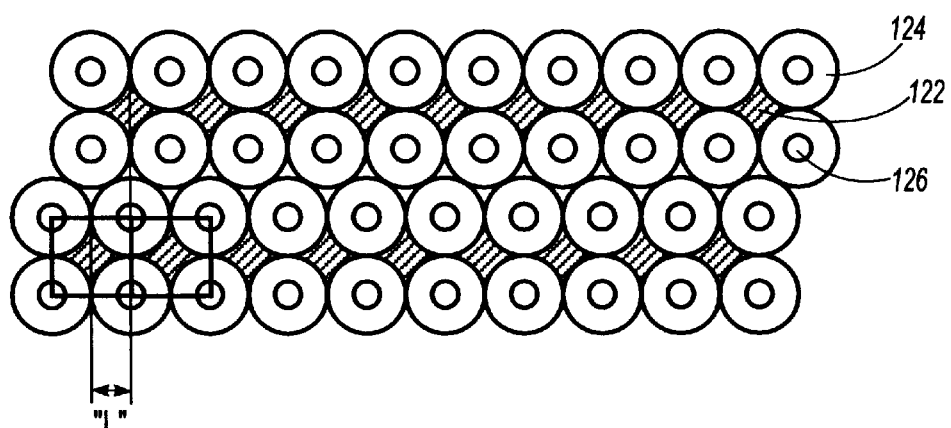
FIG. 14 shows an array of lasers which is formed by repeating the square bounding pattern shown in FIG. 13.
Figure 15:
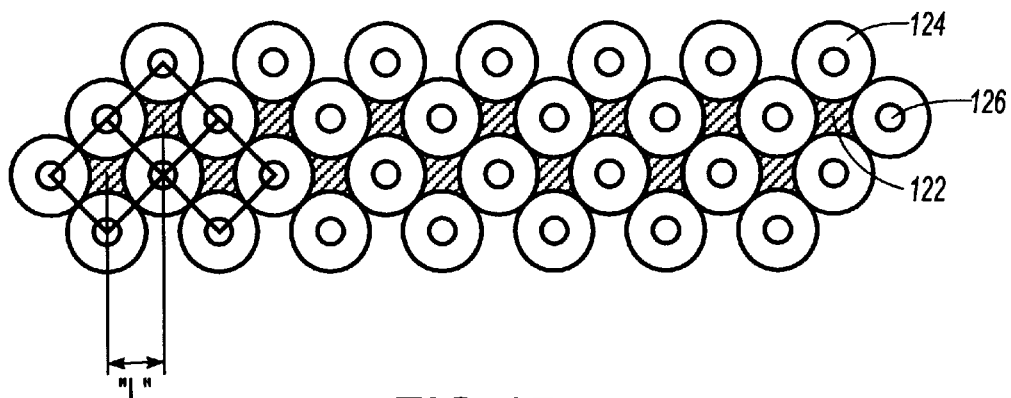
FIG. 15 shows another array of lasers which is formed by repeating the square bounding pattern shown in FIG. 13.

In the laser device of FIG. 13 and the arrays of FIGS. 14 and 15, the square bounding pattern of cylindrical cavities 126 is illustrated. Oxidized regions 124 will overlap to form the unoxidized laser aperture 122. This packing arrangement shown in FIG. 13 may be repeated to form a laser array as shown in FIGS. 14 or 15 If a packing arrangement such as FIG. 14 is used and the spacing between the centers of two adjacent cylindrical cavities is "S," a typical linear spacing "L" between two laser apertures is approximately "S." If an arrangement such as FIG. 15 is used and the spacing between the centers of two cylindrical depressions is "S," a typical linear spacing "L" between two laser apertures is approximately "√2×S."

Figure 16:
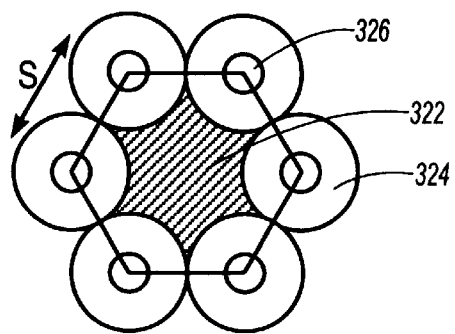
FIG. 16 shows a laser structure whose aperture is defined by a bounding pattern of six cavities arranged in an hexagonal pattern.
Figure 17:
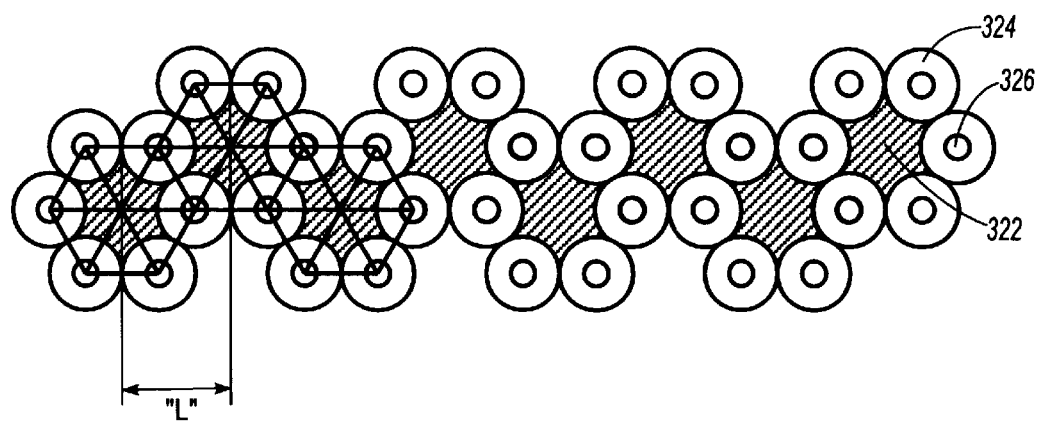
FIG. 17 shows an array of lasers which is formed by repeating the hexagonal bounding pattern shown in FIG. 16.
Figure 18:
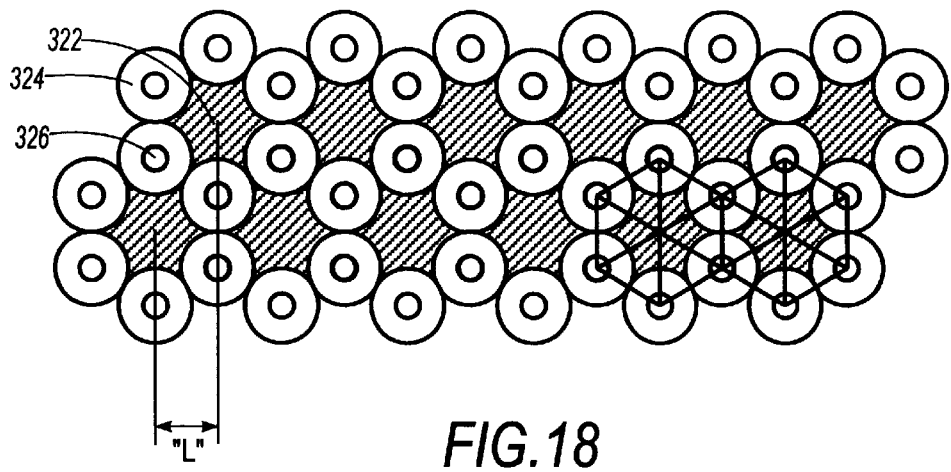
FIG. 18 shows another array of lasers which is formed by an alternative repeating of the hexagonal bounding pattern shown in FIG. 16.

In the laser device of FIG. 16 and the arrays of FIGS. 17 and 18 an hexagonal bounding pattern of cylindrical cavities is illustrated. It should be apparent that the cavities 326 may also be arranged at the vertices of any other polygon. As in the previously described embodiments, the laser aperture is formed by the unoxidized region 322 defined by the oxidized regions 324. The packing arrangement shown in FIG. 16 may be repeated to form a laser array as shown in FIGS. 17 or 18. If an arrangement such as FIG. 17 is used and the spacing between the centers of two adjacent cylindrical cavities is "S," a typical linear spacing "L" between two laser apertures is approximately "1.5S." If an arrangement such as FIG. 18 is used, the closest linear spacing "L" between two laser apertures is approximately "√3×0.5S."

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and GaAlAs, other semiconductor materials such as GaAlSb, InAlGaP, or other III-V alloys may also be used.

The planar laterally-oxidized (PLO) VCSELs described above utilize holes or cavities 126, 226 or 326 to penetrate upper DBR mirror 114. Cavities 126, 226 or 326 serve to expose buried high aluminum layer 112 that is then selectively oxidized. Cavities 126, 226 or 326 may be arranged at the vertices of a polygon such that upon oxidation, the oxidized regions, such as oxidized regions 124 of cavities 126 border VCSEL aperture 122. Because oxidized regions 124 bordering aperture 122 have a refractive index lower than the refractive index of aperture 122 and are electrically insulating, oxidized regions 124 form a good lateral waveguide that also functions to confine current to aperture 122. The planar surface areas between cavities 126 allows electrical contacting and routing to be established in a planar manner. Inter-device isolation is accomplished using ion implantation.

Figure 19:
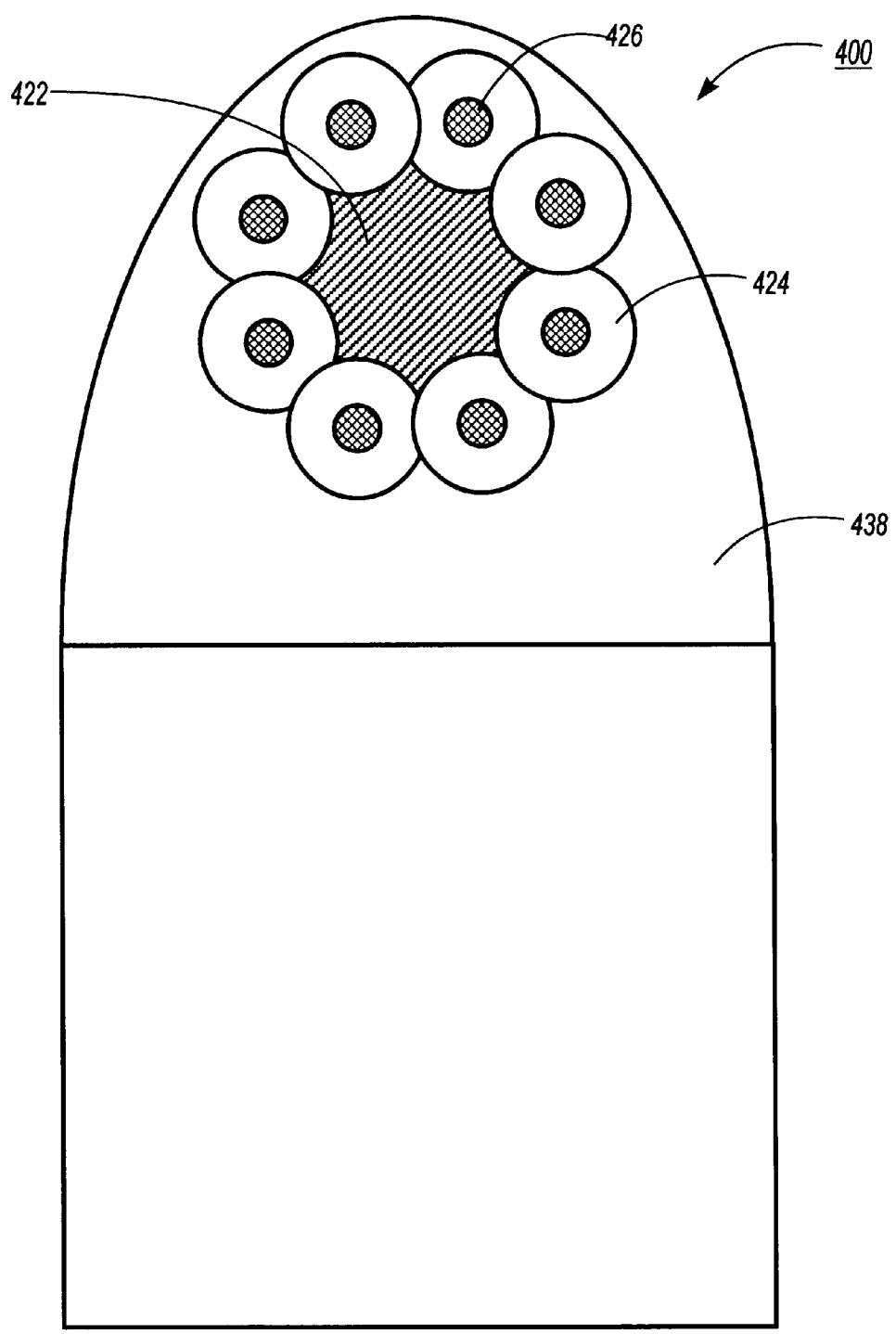
FIG. 19 shows a typical planar laterally oxidized VCSEL.

FIG. 19 shows planar laterally oxidized (PLO) VCSEL 400. Typically, cavities 426 have a 2 μm diameter and cavities 426 are placed at the vertices of a regular octagon. Cavities 426 are typically positioned with a center to center spacing of about 5 μm. Oxidation regions 424 extend by about 3.5 μm from the edges of cavities 126, typically leaving aperture 422 with a 4 μm width. Light is emitted from aperture 422 of VCSEL 400 through ITO electrode 438.

Figure 20:
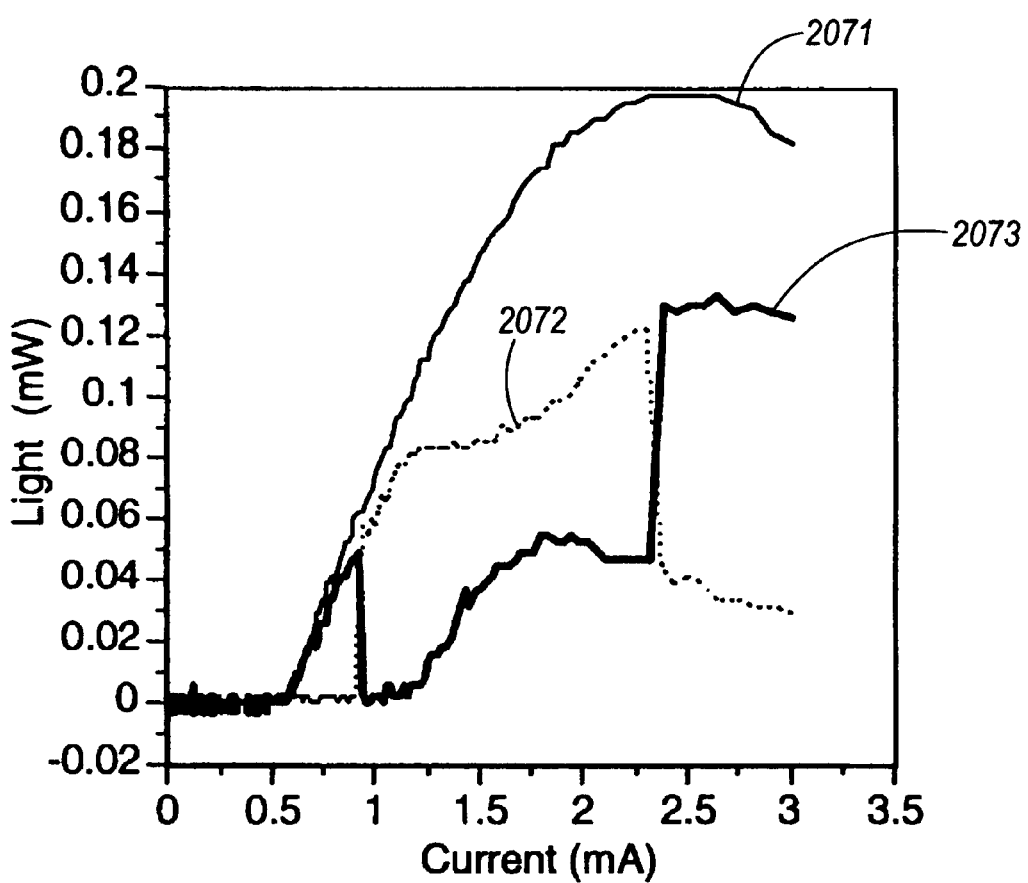
FIG. 20 shows a light output power versus current plot for a typical planar laterally oxidized VCSEL.

FIG. 20 shows the light output power versus current characteristics of an embodiment of VCSEL 400. Curve 2071 shows the light from VCSEL 400 with no polarization filter applied. Curve 2072 shows the light from VCSEL 400 having a polarization along direction 2320 (see FIG. 23) inclined at an angle of about 4.1 degrees relative to the [011] crystallographic direction. Curve 2073 shows light from VCSEL 400 having a polarization along the [011] crystallographic direction. FIG. 20 shows that the light from VCSEL 400 is initially polarized along direction 2325 which is the [011] direction but that the polarization switches abruptly to direction 2320 (see FIG. 23) when the current reaches approximately 0.8 mA as is indicated by the sudden drop in curve 2073 and the corresponding rise in curve 2072. Curve 2073 rises again at currents above about 1.25 mA indicating the reappearance of a [011] polarized lasing mode. However, curve 2072 remains greater than curve 2073 between about 1.25 mA and 2.25 mA, which shows that the dominant polarization mode is along direction 2320 in this current range. The dominant polarization mode switches to direction 2325 beyond about 2.25 mA.

Embodiments of VCSEL 400 that are seemingly identical may behave differently with respect to the polarization direction and polarization switching as shown in "Anisotropic apertures for polarization-stable laterally oxidized verticalcavity lasers" by Chua et al., Applied Physics Letters vol. 73, no. 12, pp. 1631–1633 which is incorporated by reference in its entirety. This is indicative of the polarization instability inherent in conventional devices such as, for example, VCSEL 400.

Figure 21:
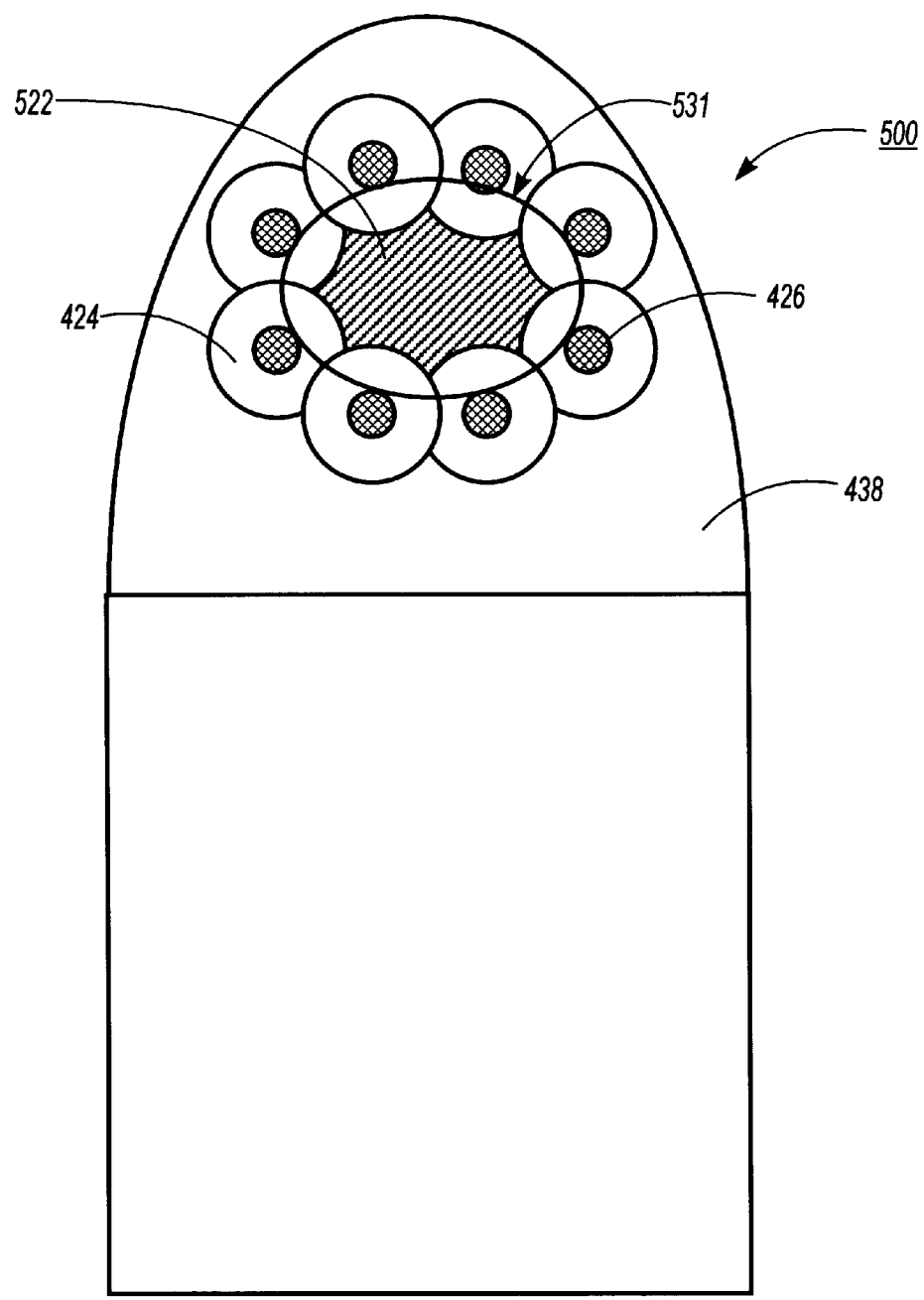
FIG. 21 shows an embodiment of a planar laterally oxidized VCSEL in accordance with the invention.

A stable polarization can be achieved if the symmetry between two orthogonal axes is broken by a sufficiently large perturbation. In an embodiment in accordance with the invention, FIG. 21 shows this symmetry breaking may be created by making aperture 522 asymmetric by arranging holes or cavities 426 at the vertices of a distorted octagon. The distorted octagon is compressed by, for example, about 1.5 $\mu$m along the [011] direction and elongated by 1.5 $\mu$m along direction 2320 (see FIG. 23). Upon oxidation, oval-like aperture 522 is formed. Ion implantation is performed outside of ellipsoidal region 531 consistent with the discussion above.

During oxidation, AlGaAs layer 124 surrounding aperture 122 contracts and the change in thickness of layer 124 results in mechanical stresses at the boundary between layer 124 and aperture 122 (see FIG. 7). The anisotropic stress resulting from oval-like aperture 522 removes the polarization modal gain degeneracy. Hence, a significant polarization preference is established along one of the two orthogonal axes resulting in stable polarization independent of the current level in the operating range. The difference in gain available to the two orthogonal polarization states is due to the differential gain that develops with the asymmetric stress and the different modal gain resulting from stress-induced birefringence.

Figure 22:
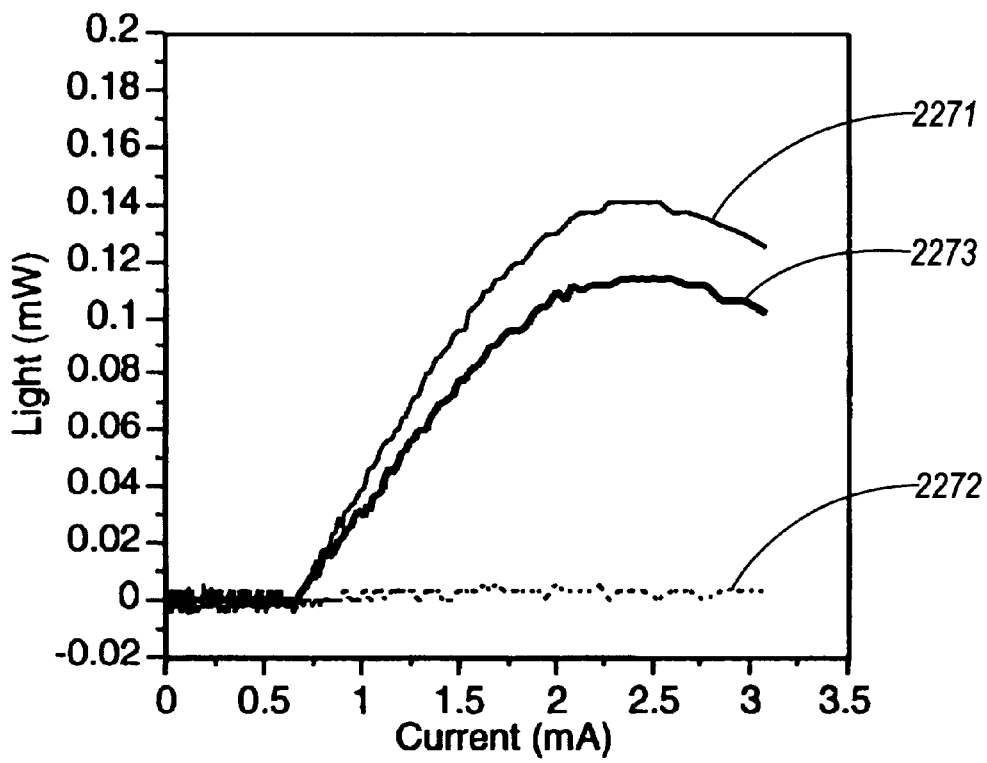
FIG. 22 shows a light output power versus current plot for the embodiment shown in FIG. 21.

FIG. 22 shows polarization-resolved light output power versus current curves obtained from an embodiment of VCSEL 500 in accordance with the present invention. Curve 2271 shows the light output power without polarization filter. Curve 2272 shows that laser output in direction 2320 (see FIG. 23) is completely suppressed throughout the operating regime. Curve 2273 shows that VCSEL 500 displays stable polarization along the [011] direction throughout the operating regime. The polarization suppression ratio is 18 dB for curve 2272 relative to curve 2273 at a current level of about 2.5 mA where peak light output power is reached.

Figure 25:
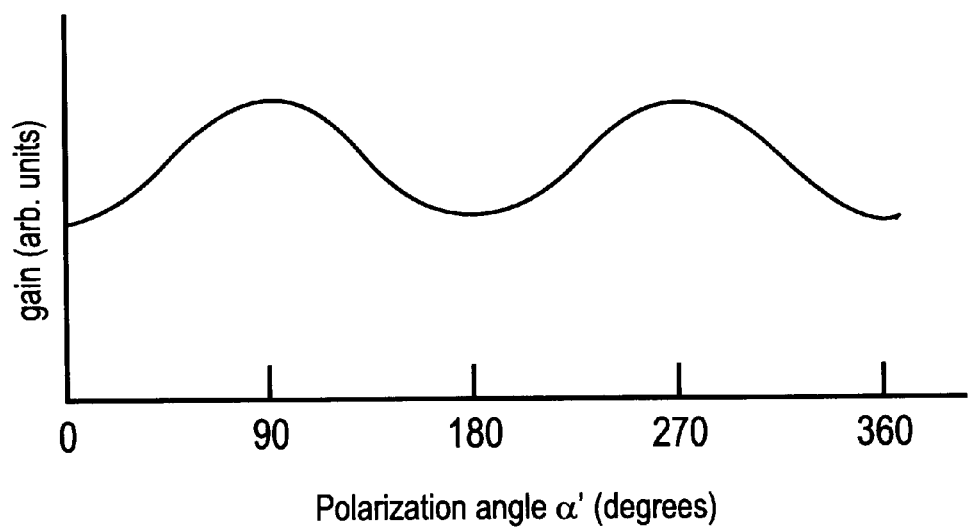
FIG. 25 shows gain anisotropies for a misoriented substrate.

Asymmetric apertures 522 on VCSELs 500 that are rotated ±90° from the orientation shown in FIG. 25 exhibit an enhanced output with polarization in direction 2320 relative to symmetric aperture 422 but laser light polarized in the [011] direction is not completely suppressed if the substrate orientation favors the [011] polarization direction. Suppression of laser light polarized in all but the desired polarization direction is possible if both the substrate orientation and the aperture asymmetry favor laser light polarized in the desired polarization direction.

Figure 23:
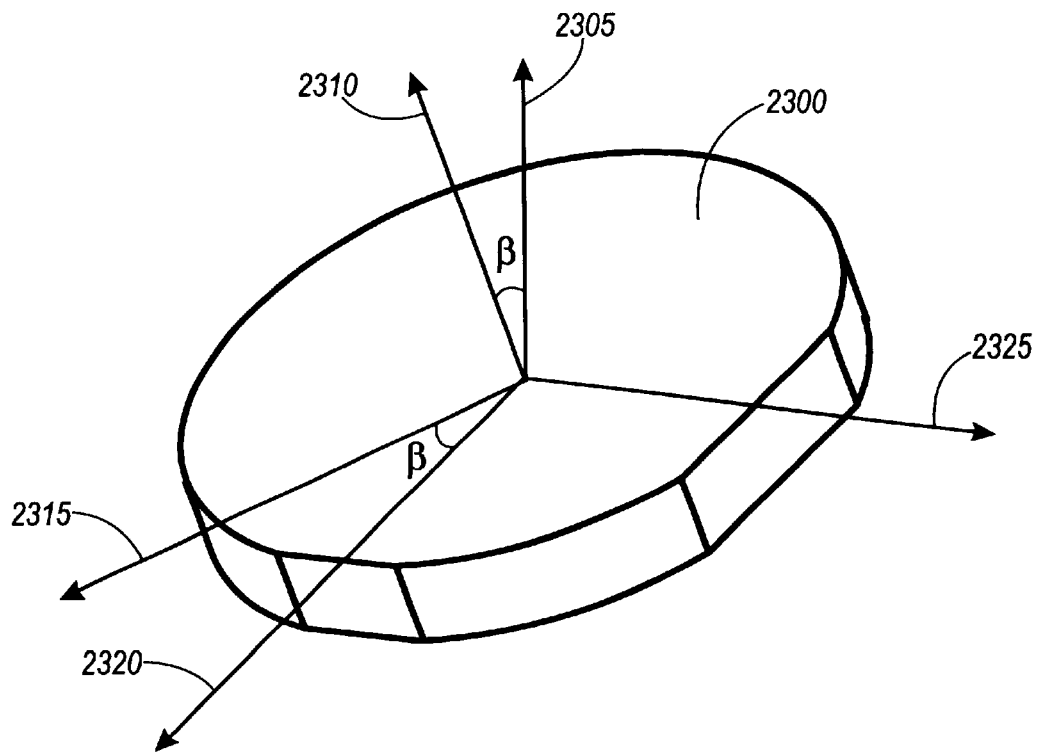
FIG. 23 shows a misoriented substrate relative to standard crystallographic orientations.

Substrate 2300 (see FIG. 23) used in one embodiment of VCSEL 500 in accordance with the present invention has the characteristics as shown in FIG. 22 with a substrate surface cut in a crystal plane that is tilted toward the [011] crystallographic axis. FIG. 23 shows misoriented substrate 2300 with surface vector 2310 misoriented relative to [100] direction 2305 of a (100) oriented substrate surface. The misorientation is by angle of rotation $\beta$ about [011] direction 2325 toward [011] direction 2315. Misorientation relative to any of the <111> axes also results in anisotropic polarization selectivity. The <111> axes are oriented at an angle $\theta$ relative to the <100> axes where $\sin^2\theta=\frac{2}{3}$. For the embodiment of FIG. 22, angle of rotation $\beta$ is about 4.1 degrees. Groups of VCSEL 500 may be made in arrays resulting, for example, in arrays similar to those shown in FIGS. 17 and 18 with printer and other applications.

Figure 24:
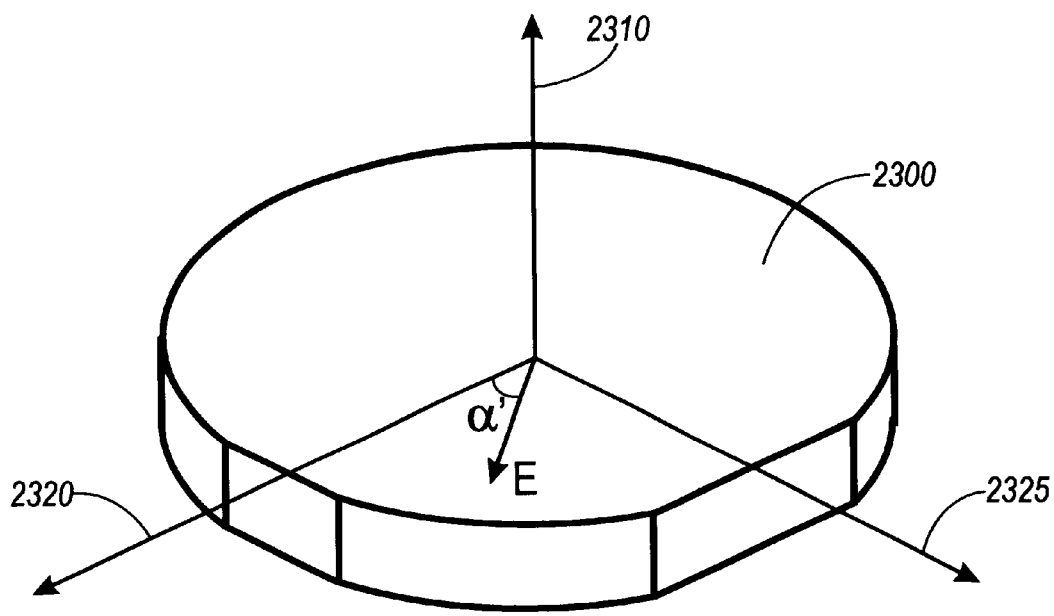
FIG. 24 shows the orientation of the electric field vector relative to misoriented substrate.

FIG. 24 shows the orientation of electric field vector E at polarization angle $\alpha'$ with respect to axis 2320 of an embodiment of misoriented substrate 2300 in accordance with this invention for light exiting substrate 2300. FIG. 25 shows the corresponding gain that is achieved in arbitrary units versus the polarization angle $\alpha'$ for an embodiment of misoriented substrate 2300. The gain is seen to vary with polarization angle $\alpha'$ in a periodic manner. The gain is higher for E fields polarized along ±[011] direction 2325. Therefore, misoriented substrate 2300 favors laser light polarized in ±[011] direction 2325 over laser light polarized in ±direction 2320.

However, substrates that are misoriented along a different direction and by different angles can also produce gain anisotropies. Since standard (100)-oriented substrates have crystal symmetries that belong to the $D_{4h}$ point group, their gain properties are isotropic in the substrate plane as a function of angle. Misoriented substrates, however, can have symmetries that produce gain anisotropies leading to directional gain dependencies as shown, for example, in FIG. 25 for an embodiment of substrate 2300.

Gain curves for a given substrate orientation can be determined by first calculating the quantum wave functions using the multiband effective mass theory for the valence band and Kane's model (e.g., see E. O. Kane, in Journal of Physics and Chemistry of Solids, v.1, p. 249, (1957), incorporated by reference in its entirety) for the conduction band. In the multiband effective mass theory, the valence band Hamiltonian for a (100) substrate consists of the Luttinger-Kohn Hamiltonian (e.g., see J. M. Luttinger and W. Kohn in Physical Review, v. 97, p.869 (1955), incorporated by reference in its entirety) and a strain-orbit potential term if the active layer is under stress. Details regarding the strain-orbital term may be found in G. E. Pikus and G. L. Bir in Soviet Physics-Solid State, vol. 1, 1502 (1960) incorporated by reference in its entirety.

Several sources of stress exist. First, stress on active layer 108 (see FIG. 3) occurs because of the lattice mismatch between active layer 108 and GaAs substrate 100 resulting in a stress ranging from 0.01% to 1%, and typically about 0.5% compressive stress for the embodiment shown in FIGS. 21 and 22. The amount and type of built-in active layer stress, if any, depends on the particular alloy chosen for the quantum wells in active layer 108. Possible alloys for quantum wells include InAlGaAs, AlGaInP, InGaAsN and AlGaAsSb. Second, reduction in the thickness of AlGaAs layer 112 during the oxidation process also produces stress. Third, cavities may be used to induce stress.

The Hamiltonians for arbitrary wafer orientations may be obtained by performing a unitary transformation on the (100) Hamiltonians: H'=U(θ,φ,γ) H U$^r$(θ,φ,γ), where U(θ,φ,γ) is the rotation operator corresponding to the Euler angles θ, φ, and γ of the substrate relative to the (100) orientation. Once the Hamiltonians are determined, the energy band structure may be solved for numerically. The gain curve as a function of direction is then obtained by calculating the density of states and evaluating the relevant optical matrix elements.

The substrate orientation necessary to produce a desired gain versus polarization angle dependency can be investigated, for example, by using the PICS3D software program available from Crosslight Software, Inc. at 5450 Canotek Road, Unit 56, Gloucester, Ontario, Canada K1J9G4.

Figure 26:
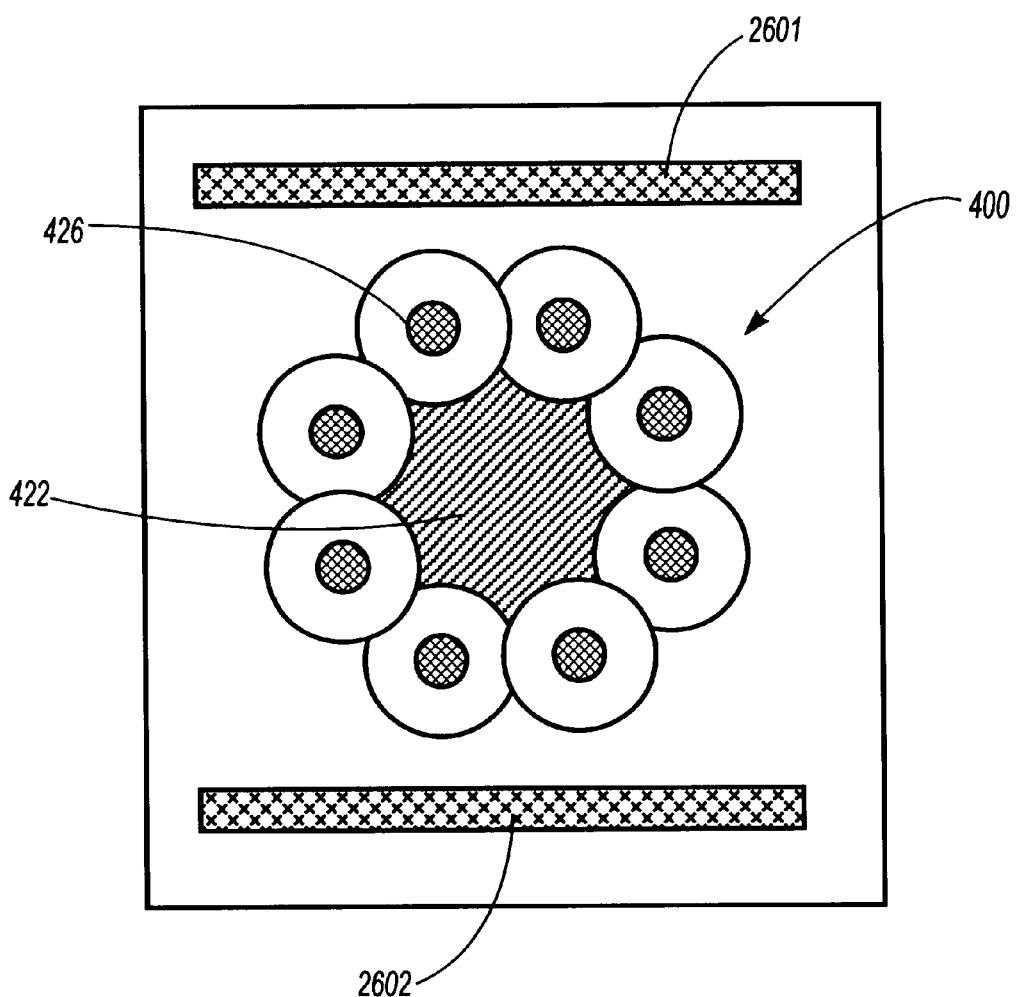
FIG. 26 shows an embodiment of a planar laterally oxidized VCSEL in accordance with the invention.

FIG. 26 shows VCSEL 400 with etched cavities 2601 and 2602 in accordance with an embodiment of this invention. Aperture 422 is not asymmetric but cavities 2601 and 2602 are etched on either side of VCSEL 400, typically placed as close as possible to aperture 422, to induce an asymmetry on active region of VCSEL 400. One cavity or more than two cavities may also be used to generate differential loss and/or stress on VCSEL 400. Typically, cavities 2601 and 2602 are etched at the same time and using the same process as cavities 426. Hence, the depth of cavities 2601 and 2602 is about the same as the depth of cavities 426. However, cavities 2601 and 2602 can also be formed at a different time and using a different process from cavities 426. For example, cavities 2601 and 2602 in an embodiment in accordance with the invention may be formed using focused ion beam milling subsequent to fabrication of VCSEL 400. Cavities 2601 and 2602 may be filled with a filler material having a coefficient of thermal expansion different from substrate 100 to enhance the function of cavities 2601 and 2602 (see FIG. 3). For example, cavities 2601 and 2602 may be filled with a metal, semiconductor or dielectric material. The filler material is deposited at temperatures well in excess of the operating temperature of VCSEL 400 so that as the filler cools a stress is induced in VCSEL 400.

If VCSEL 400 is grown on misoriented substrate 2300, cavities 2601 and 2602 may be oriented perpendicular to the direction of polarization reinforced by misoriented substrate 2300 to further suppress the polarization instability for VCSEL 400.

Figure 27:
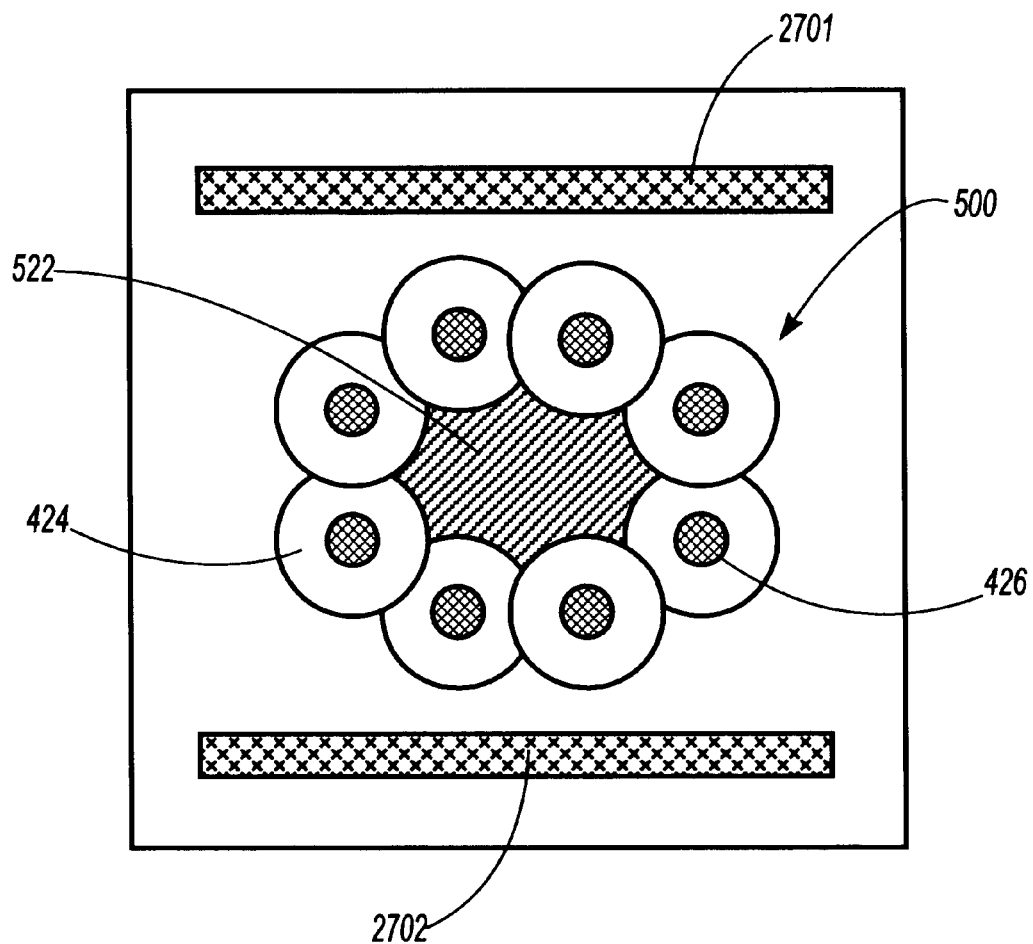
FIG. 27 shows an embodiment of a planar laterally oxidized VCSEL in accordance with the invention.

FIG. 27 shows VCSEL 500 with etched cavities 2701 and 2702 in accordance with an embodiment of this invention. Aperture 522 is asymmetric and cavities 2701 and 2702 are etched on either side of VCSEL 500, typically placed as close as possible to aperture 522, to reinforce the asymmetry on the active region of VCSEL 500. One cavity or more than two cavities may also be used to generate differential loss and/or stress on VCSEL 500. Typically, cavities 2701 and 2702 are etched at the same time and using the same process as cavities 426. Hence, the depth of cavities 2701 and 2702 is about the same as the depth of cavities 426. However, cavities 2701 and 2702 can also be formed at a different time and using a different process from cavities 426. For example, cavities 2701 and 2702 in accordance with an embodiment the invention may be formed using focused ion beam milling subsequent to fabrication of VCSEL 500. Cavities 2701 and 2702 may be filled with a filler material having a coefficient of thermal expansion different from substrate 100 to enhance the function of cavities 2701 and 2702 (see FIG. 3). For example, cavities 2701 and 2702 may be filled with a metal, semiconductor or dielectric material. The filler material is deposited at temperatures well in excess of the operating temperature of VCSEL 500 so that as the filler cools a stress is induced in VCSEL 500.

If VCSEL 500 is grown on misoriented substrate 2300, cavities 2701 and 2702 and the major axis of aperture 522 may be oriented perpendicular to the direction of polarization reinforced by misoriented substrate 2300 to further suppress the polarization instability for VCSEL 500.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A vertical-cavity surface emitting laser device for producing polarized light comprising:

a substrate;

a plurality of semiconductor layers formed on a surface of said substrate;

one of said semiconductor layers comprising an active layer having an active region therein;

a first reflector located on one side of said active layer and a second reflector located on the opposite side of said active layer, at least one of said reflectors allowing partial transmission of light therethrough;

one of said semiconductor layers being a current controlling layer having a first axis substantially orthogonal to a second axis in a plane substantially parallel to said surface of said substrate, said current controlling layer being penetrated by a plurality of non-conducting cavities;

an asymmetric aperture region in said current controlling layer which controls current flowing through said active region, said asymmetric aperture region being defined by a conductive region in said current controlling layer bordered by non-conductive regions in said current controlling layer such that a first dimension of said conductive region along said first axis is less than a second dimension of said conductive region along said second axis to produce light polarized in a preferred direction, and wherein each of said non-conductive regions surrounds at least one of said plurality of non-conducting cavities; and first and second electrodes located on said laser device to enable biasing of said active region.

2. The device of claim 1 wherein said surface of said substrate is misoriented with respect to the {100} and {111} planes of said substrate resulting in polarization directions of maximum gain and wherein said directions of maximum gain are substantially aligned with said preferred direction.

3. The device of claim 1 wherein a cavity having a width and a length is positioned adjacent to said asymmetric aperture region such that said length of said cavity is substantially parallel to said second dimension of said conductive region.

4. The device of claim 3 wherein said surface of said substrate is misoriented with respect to the {100} and {111} planes of said substrate resulting in polarization directions of maximum gain and wherein said directions of maximum gain are substantially aligned with said preferred direction.

5. The device of claim 1 wherein said first dimension of said conductive region is between 30% and 75% of said second dimension of said conductive region.

6. The device of claim 1 wherein said first electrode is comprised of ITO.

7. The device of claim 1 wherein said device is one of an array of substantially identical devices emitting light having substantially the same direction of polarization.

8. The device of claim 2 wherein said device is one of an array of substantially identical devices emitting light having substantially the same direction of polarization.

9. The device of claim 1 wherein said device is one of a plurality of devices arranged in an array such that at least one of said plurality of devices has a direction of polarization different from said device.

10. The device of claim 8 wherein said first electrode is comprised of ITO.

11. The device of claim 2 wherein said substrate misorientation is at least 4.1°.

12. The device of claim 1 wherein said cavities are located at the vertices of a distorted octagon.

13. A vertical-cavity surface emitting laser device for producing polarized light comprising:

a substrate;

a plurality of semiconductor layers formed on a surface of said substrate;

one of said semiconductor layers comprising an active layer having an active region therein;

a first reflector located on one side of said active layer and a second reflector located on the opposite side of said active layer, at least one of said reflectors allowing partial transmission of light therethrough;

one of said semiconductor layers being a current controlling layer said current controlling layer being penetrated by a plurality of non-conducting cavities;

an aperture region in said current controlling layer which controls current flowing through said active region, said aperture region being defined by a conductive region in said current controlling layer bordered by non-conductive regions in said current controlling layer and a cavity adjacent to said aperture region to induce an asymmetry on said active region so as to produce light polarized in a preferred direction, and wherein each of said non-conductive regions surrounds at least one of said plurality of non-conducting cavities; and first and second electrodes located on said laser device to enable biasing of said active region.

14. The device of claim 13 wherein said surface of said substrate is misoriented with respect to the {100} and {111} planes of said substrate resulting in polarization directions of maximum gain and wherein said directions of maximum gain are substantially aligned with said preferred direction.

15. The device of claim 13 wherein said cavity is filled with a filler material having a first thermal coefficient of expansion different from a second thermal coefficient of expansion of said substrate.

* * * * *